United States Patent [19]

Bialko et al.

[11] 4,131,533

[45] Dec. 26, 1978

[54] RF SPUTTERING APPARATUS HAVING FLOATING ANODE SHIELD

[75] Inventors: Joseph A. Bialko; John S. Lechaton, both of Wappingers Falls, N.Y.

[73] Assignee: International Business Machines Corporation, Armonk, N.Y.

[21] Appl. No.: 865,812

[22] Filed: Dec. 30, 1977

[51] Int. Cl.² ............................................. C23C 15/00
[52] U.S. Cl. .............................. 204/298; 204/192 D
[58] Field of Search ........... 204/192 R, 192 C, 192 D, 204/298

[56] References Cited

U.S. PATENT DOCUMENTS

| 3,617,459 | 11/1971 | Logan | 204/192 |
|---|---|---|---|
| 3,743,587 | 7/1973 | Kennedy | 204/192 |
| 3,755,123 | 8/1973 | Davidse et al. | 204/192 |
| 3,763,031 | 10/1973 | Scow et al. | 204/298 |
| 3,860,507 | 1/1975 | Vossen, Jr. | 204/192 |

OTHER PUBLICATIONS

R. P. Auyang et al., "Power Network for Substrate," *IBM Tech. Disc. Bull.*, vol. 14, p. 1032 (1971).

J. S. Logan, "Control of RF Sputtered Film Properties Through Substrate Tuning," *IBM J. Res. Dev.*, pp. 172–175 (1970).

*Primary Examiner*—John H. Mack
*Assistant Examiner*—Aaron Weisstuch
*Attorney, Agent, or Firm*—Thomas F. Galvin

[57] ABSTRACT

Isolating the anode shield of RF sputtering apparatus from the ground potential reduces the grounded surfaces to which the plasma is exposed and thereby increases the impedance between the plasma and the grounded surfaces. This improvement increases the resputtering rate significantly before the operating point of instability in the system is reached.

16 Claims, 2 Drawing Figures

RF SPUTTERING APPARATUS HAVING FLOATING ANODE SHIELD

BACKGROUND OF THE INVENTION

1. Field of the Invention

This invention relates to radio frequency (RF) sputtering apparatus for depositing materials on substrates.

2. Description of the Prior Art

The sputtering of dielectric materials by radio frequency fields has become increasingly important with the development of integrated semiconductor circuit devices. Insulating films of electrically stable, high melting or softening point materials can be applied to suitable semiconductor substrates with better results than are achievable with other processes such as evaporation and chemical vapor deposition. RF sputtering allows glass to be contoured or shaped during deposition by the technique of controlled resputtering. In addition, resputtered glass is not as porous and does not contain as many OH molecules as glasses deposited by other processes.

As is known in the art, the deposition of films by RF sputtering has advantages over DC sputtering; mainly the latter can't be used to sputter insulators without the provision of an electron source to neutralize the target. In addition, RF sputtering apparatus may be used to "planarize" a sputtered film, either during the deposition process or after the non-planar film has been deposited.

The phenomenon of resputtering involves the re-emission of deposited insulative material, such as $SiO_2$, during the sputter deposition thereof through the effects of attendant ion bombardment of the deposited insulative layer. The application of the principles of RF sputtering to resputtering is disclosed in the article "Re-Emission Coefficients of Silicon and Silicon Dioxide Films Deposited Through RF and DC Sputtering," R. E. Jones et al, Journal of Applied Physics, November 1967, pages 4656. In effect, resputtering is the positive ion bombardment of an insulative film during its deposition.

The prior art has recognized that resputtering improves the quality of sputter deposited film, U.S. Pat. No. 3,661,761 discloses the use of RF sputtering to improve film quality and uniformity. U.S. Pat. No. 3,983,022 discloses that resputtering at a substantially zero deposition rate can be used to planarize films deposited atop uneven surfaces.

While resputtering has been used in the commercial fabrication of integrated circuits for the purpose of improving the quality of sputter deposited film, the extent of use for complete planarization has been limited because of the amount of time necessary to achieve complete planarization of an insulative layer deposited over raised conductive line patterns on semiconductor substrates and other factors.

Sputtering apparatus described by Auyang et al in the IBM Technical Disclosure Bulletin, September 1971, page 1032 has been used for planarization of thin films. However, the control of this apparatus, known as a "Driven" system is complicated by the requirement for adjusting five variable reactances. This requires the services of a skilled technician; as a result driven systems would be difficult to control in large scale manufacturing.

Another well known RF sputter deposition system, now termed a "tuned-anode" system, is described in the article by J. S. Logan entitled "Control of RF Sputtered Film Properties through Substrate Tuning", IBM Journal of Research and Development, Volume 14, pages 172–175, 1970. In this apparatus a tunable L-C network is disposed between the insulated substrate electrode and a reference potential, ordinarily ground. By this means the RF current through the substrate electrode and, therefore, the amount of resputtering from the substrates disposed thereon may be controlled. As noted by Logan, this control of resputtering is required for good edge coverage of the deposited insulator over steps in the substrates. But the amount of resputtering is limited and the tuned anode system has not heretofore been used successfully for planarization.

Usually, before sufficient RF current through the substrate electrode, termed the anode, can be obtained the system becomes unstable. This is evidenced by a sudden increase in RF current from the plasma to the grounded parts of the internal tooling. There is a corresponding decrease in anode current. This effect is illustrated in terms of D.C. bias in FIG. 3 of Logan publication. At the point of instability the plasma density near the chamber wall increases, with a corresponding decrease in plasma-to-chamber wall impedance. This causes a diversion of RF current to the chamber walls thereby reducing the current which is directed to the substrate electrode. One technique for minimizing this problem has been to attempt to reduce the ratio of the area of the grounded wall to the cathode area. This would reduce the amount of current which can be diverted to the wall rather than to the anode. The extent of this solution is necessarily limited due to purely geometrical considerations.

SUMMARY OF THE INVENTION

It is therefore an object of this invention to improve the design of RF sputtering apparatus.

It is a further object of this invention to increase the rate of resputtering in RF sputtering systems.

It is yet another object to achieve planarization in a tuned-anode system.

These and other objects of our invention are achieved by isolating the anode shield of RF sputtering apparatus from the ground potential. This reduces the grounded surfaces to which the plasma is exposed and thereby increases the impedance between the plasma anode and the grounded surfaces. This improvement increases the resputtering rate significantly before the operating point of instability in the system is reached.

Our invention has enabled us to accomplish the deposition of both standard (non-planar) and planar glass on semiconductor wafers in the same tuned-anode system merely by changing the reactance of the tuning network.

Another feature of our invention is a novel anode shield structure wherein the shield is sectioned for ease of cleaning and accurate alignment of the gap between the shield and substrate electrode (anode).

DESCRIPTION OF THE PREFERRED EMBODIMENT

Figure 1:
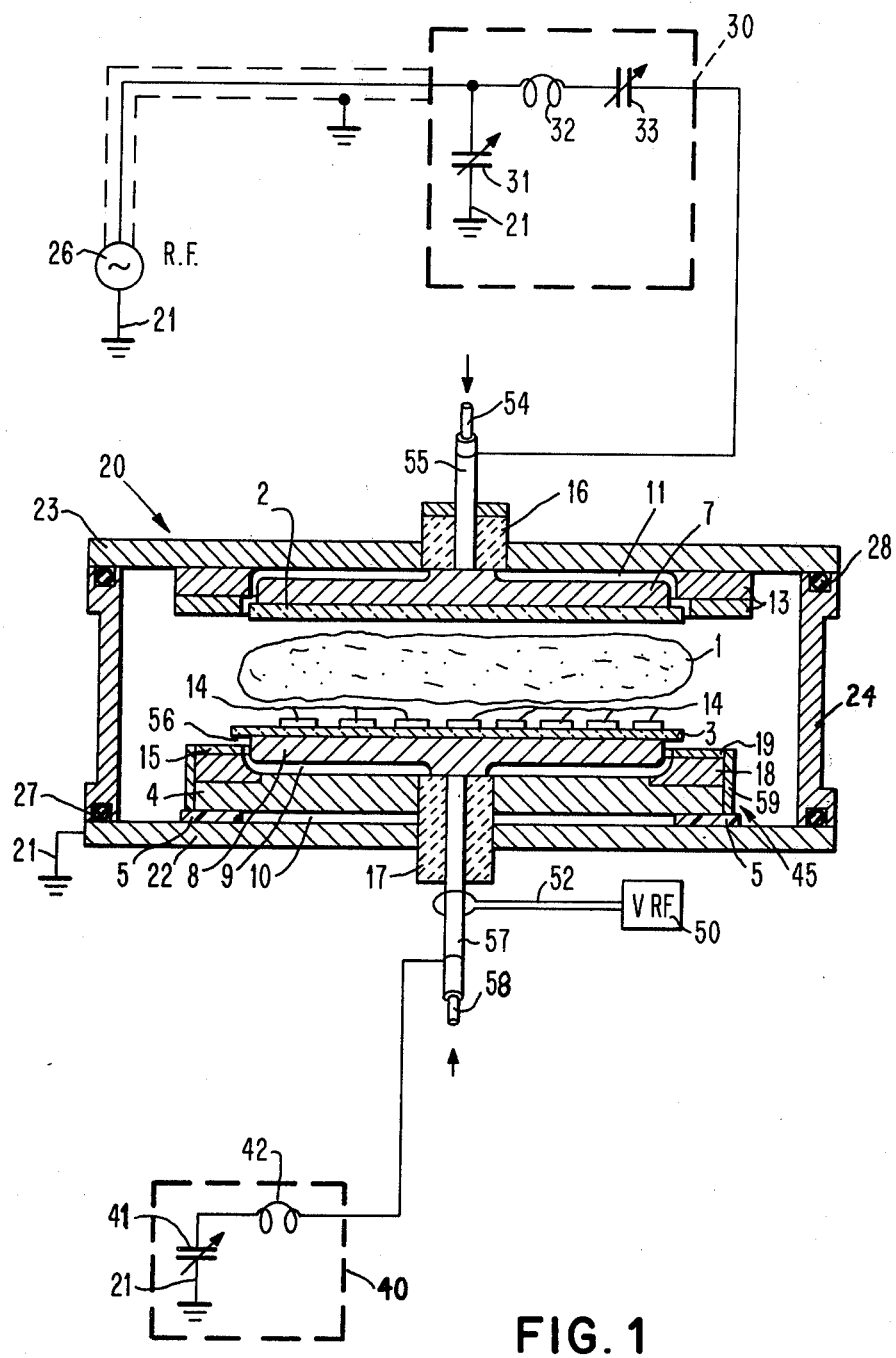
FIG. 1 is a cross-sectional view of the preferred embodiment of the sputtering apparatus according to our invention.

Prior to discussing the apparatus illustrated in FIG. 1, a brief review of the RF sputtering operation will be helpful in setting the invention in perspective. In RF sputtering the target electrode, which either consists of the material to be deposited or supports said material, is termed a cathode. The substrate, to which the material from the target is to be directed, is termed an anode. Articles such as semiconductor wafers are disposed on the anode to receive the target material under the influence of the electric field established between these two electrodes. A gas is ionized, producing charged gas ions which are attracted toward the cathode. The ions are accelerated within the region around the cathode termed the "Crooks dark space" so that they bombard the target with sufficient impact to eject atomic particles from the target. These sputtered particles of target material will be deposited upon nearby objects; and the aim of all sputtering systems is to have the sputtered material deposited upon the articles such as semiconductor wafers which are mounted on the anode, or substrate electrode.

RF sputtering with radio frequency excitation in the low megahertz range, for example 13.56 MHz up to around 40 MHz, is the usual range used today due to F.C.C. regulations. With the properly selected frequency and magnitude of applied voltage, the sputtering action can be confined to the dielectric target alone or the sputtering action may also occur from the substrates disposed on the anode, whereby atomic particles may be "resputtered" from the substrates, similar to the sputtering which occurs from the target material at the cathode target.

In any sputtering operation it is desirable that only target material or, in the case of resputtering, substrate material be ejected. Therefore, it has been necessary to protect other parts of the structure associated with the cathode and anode from the bombarding action of the ions. This customarily is accomplished by placing a grounded shield around the cathode or anode or both. However, in RF sputtering such shielding is not without penalties because we have found that such shields can divert current from the anode.

The control of the properties of RF sputtered films, including film uniformity and planarization, is best accomplished through the technique and apparatus described by J. S. Logan in the aforementioned publication as improved by our invention. The technique described by Logan is commonly termed a tuned-anode system. In his system the impedance between the substrate holder, or anode, and a relatively large conductive surface within the sputtering chamber in contact with the plasma is controlled, to thereby control the voltage magnitude of the anode and its phase with respect to the cathode voltage. The system includes a series inductance-capacitance tuning network connected between the anode and ground which can be varied from a capacitive reactance through a series resonance (zero reactance) to an inductive reactance. The network can be made to resonate in parallel with the stray capacitance between the anode and ground so that the net reactance between the anode and ground is continuously variable from zero to a very large inductive or capacitive value.

Logan's variable impedance tuning network at the anode provides a degree of control when sputtering dielectric films onto substrates. It controls the relative RF voltage between the anode and the metal base plate, top plate or sidewalls of the chamber and the anode shield, all of which are grounded in the prior art apparatus.

FIG. 1 illustrates an up-to-date version of the Logan tuned anode system which incorporates our invention. The system includes a low pressure gas ionization chamber 20 which is connected to a first reference potential 21, in this case ground. Chamber 20 includes a metallic chamber wall 24 which is mounted between a pair of metallic base plates 22 and 23. Gaskets 27 and 28 provide a tight vacuum seal. Chamber 20 is typically made of aluminum or stainless steel with aluminum liners. A suitable inert gas such as argon is introduced into the chamber through an inlet (not shown) and maintained at a low pressure by means of a vacuum pump and pressure controller (also not shown). Within the gas-filled chamber are positioned a target electrode 7, preferably copper having mounted thereon a disc 2 of the material to be sputtered, typically silica. Surrounding the target electrode, and insulated therefrom, is a two-part shield 13 of conductive material, typically aluminum.

Disposed in proximate relationship with target electrode 7 is substrate holder electrode 8, commonly termed the anode electrode. Anode shield 45 surrounds anode 8. Disposed on anode 8, which is typically copper, is a product plate 3 which carries substrates 14. In the present case, substrates 14 are typically semiconductor integrated circuit wafers upon the surface of which is to be deposited silicon dioxide which is ejected from silica target 2.

The substrate holder 8 is mounted on an insulating support member 17 and target electrode 7 is mounted on an insulating support member 16. Cooling fluid is circulated through the target and substrate holder electrodes 7 and 8 by means of tubes 54 and 56, respectively.

An RF generator 26 is connected between the first reference potential 21, i.e., ground and conductor 55 which is electrically connected to target electrode 7. An impedance matching network 30 is connected between RF source 26 and conductor 55. Circuit 30 comprises capacitor 31, RF inductor 32 and capacitor 33. Both of the capacitors are variable so that circuit 30 functions as a variable impedance matching network.

Anode 8 is connected to ground 21 through conductor 57 and substrate electrode tuning circuit 40 which comprises a variable capacitor 41 and RF inductor 42. Although the preferred system includes variable capacitors, clearly the fixed inductor 32 and 42 could be replaced by variable inductors.

Impedance matching circuit 30 provides means for reducing the reflected power to generator 26 during sputtering operations. Substrate electrode tuning circuit 40 controls the RF potential to anode 8 during RF sputtering. The adjustable RF impedance between anode 8 and ground 21, which generates an RF potential by virtue of the flow of RF current through it, results in a controlled DC bias potential developed at the film surface.

Upon the application of sufficient power from RF generator 26, plasma 1 is formed in the space between target electrode 7 and plate 3. As the target 2 is bombarded by the ions in the plasma, atomic particles of the target material are sputtered off and are deposited on the substrates 14 carried by plate 3 on anode 8.

A gap 9 between anode shield 45 and anode 8 is established to avoid excessive capacitive coupling at radio frequencies. It must be small enough to exclude the plasma 1 from sputtering the back of anode 8. Gap 11 between target electrode 7 and target shield 13 serves a similar purpose.

What has been described in the previous sections is well known to those of skill in the semiconductor design art, particularly those involved with thin film deposition processes. Our invention is directed to the electrical relationship of anode shield 45 with the rest of the system, as well as to the mechanical design of the shield. As previously indicated, shield 45 has been connected to the first reference potential 21 in previous systems. The apparent reason for this is that a grounded shield serves to suppress any glow discharge that otherwise might take place behind substrate holder 3 in the vicinity of anode 8. We have found, however, that as the RF power to the system increases when resputtering of material from wafers 14 occurs the system becomes unstable, with a sudden increase in RF current from plasma 1 to the grounded parts of the system, e.g., wall 24 of chamber 20 and anode shield 45. However, in accordance with our invention, the provision of insulating spacers 5 between shield 45 and the grounded base plate 22 allows us to increase the amount of resputtering significantly before a point of instability is reached. Insulating spacer 5 is preferably Teflon, although it may comprise other insulative material. The spacer may be in the shape of a ring congruent with the lower surface of shield 45. Alternatively, a number of individual spacers may be provided sufficient to hold shield 45 away from base plate 22. Gap 10 established by spacers 5 is around 60 mils wide, although other values are effective depending on other system parameters.

By taking the anode shield off-ground, plasma 1 is further removed from ground potential 21 by reducing the grounded surfaces to which the plasma is exposed. This further increases the impedance between the plasma and ground. In electrical terms, when the impedance seen by plasma 1 to the grounded surfaces in chamber 20 increases, the current through anode 8 and conducting stem 57 increases. This allows more power to be consumed at product plate 3 in the form of sputtering off wafers 14, commonly referred to as resputtering. The increase in effective current through the system may be monitored by a current probe comprising a commercial wide-band current transformer 52 and an RF voltage meter 50. The results of our invention will be discussed in more detailed fashion with reference to FIG. 2.

Figure 2:
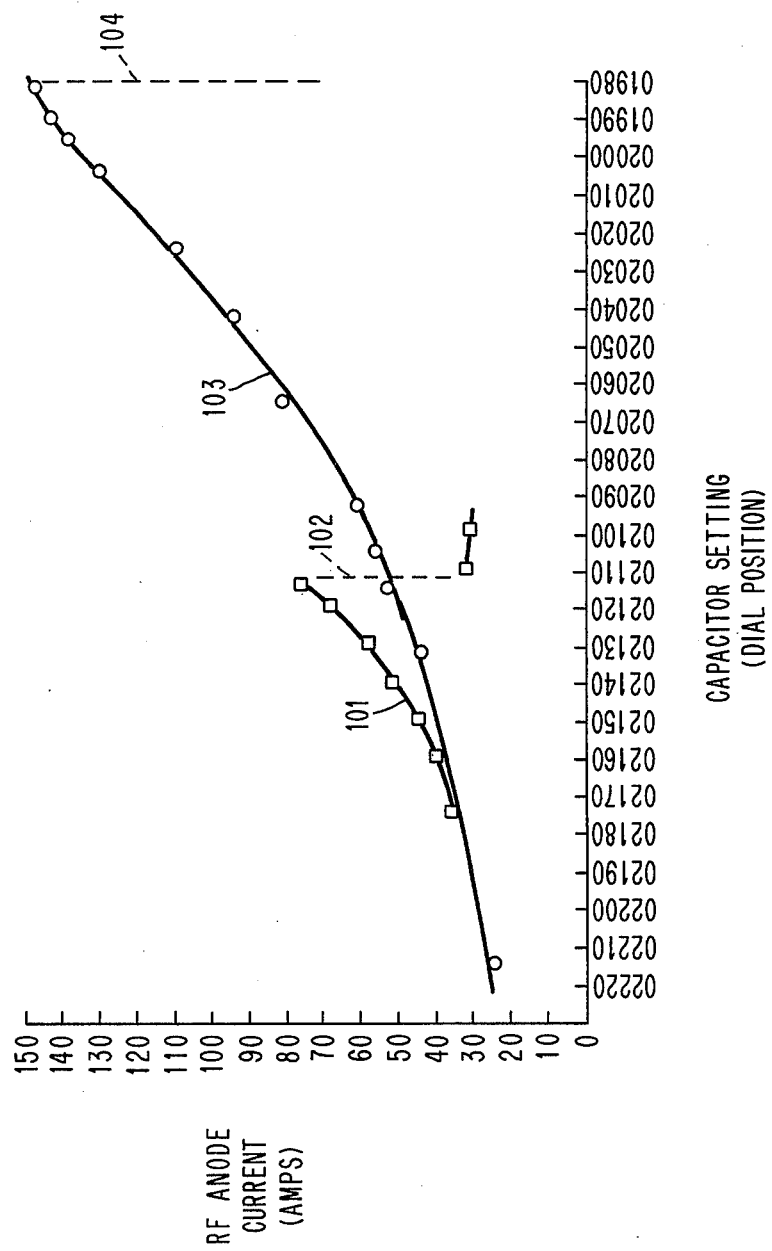
FIG. 2 is a plot of the RF anode current versus substrate tuning impedance of RF apparatus which illustrates the improvement achieved according to our invention.

In FIG. 2 there is shown a graph of RF anode current through the system versus the capacitor setting of variable capacitor 41 in tuning network 40 of FIG. 1. The RF anode current is measured by means of voltage meter 50 and current transformer 52 between anode 8 and ground 21. A decreasing capacitor setting is equivalent to a decrease in the net reactance of the anode impedance. The curve for the grounded anode shield is identified by the numerals 101 and 102. The curve for the off-ground shield is identified by the numerals 103 and 104.

With the grounded anode the point of instability is reached at around 75 amperes. This level is below that which is necessary to achieve planarization. At that point the anode current substantially decreases to around 30 amperes, as indicated by the dashed line 102. Beyond this maximum current of around 75 amperes the impedance between plasma 1 and ground 21 through anode 8 is large and the RF current in that path is much smaller. Therefore, anode 8 assumes a potential that is much closer to that of plasma; and RF current is diverted from the anode.

By taking anode shield 45 off-ground an anode current of around 150 amperes is achieved, as shown by curve 103, prior to reaching the point of instability, which is indicated by the numeral 104. A current of up to 150 amperes allows high resputtering of the $SiO_2$ deposited on semiconductor wafers.

With a sputtering apparatus similar to the one depicted in FIG. 1, silicon wafers were loaded on a 21 inch glass holder 3; anode 8 was 20 inches in diameter. A silica target with a diameter of 20.5 inches was mounted on a 20 inch cathode; an RF power of approximately 3 kilowatts was applied. The target spacing was $1.1 \pm 0.05$ inches. The argon pressure was maintained at $25 \times 10^{-3}$ torr. Runs were made in which the substrate reactance was varied by changing variable impedance 41. At each variation the RF current through 57 of anode 8 was measured. The current probe yields a voltage output which is proportional to the current.

Resputtering sufficient for good edge coverage on wafer 14 occurred at 60 amperes and for planarization at around 90 amperes, which yielded a re-emission coefficient of around 0.75. Near 150 amperes, the re-emission coefficient approached 1.0.

The other aspects of our redesigned shield will now be discussed. As shown in FIG. 1 the shield comprises three separate, concentric sections, termed a plate, a spacer and a ring and designated by the numerals 4, 18 and 19, respectively. Ring 19 and spacer 18 are fastened to spacer 18 and plate 4, respectively, by machine screws (not shown). Plate 4 is fastened to base plate 22 of chamber 20 by insulated machine screws (not shown).

As is well known to those of skill in the semiconductor thin film deposition art, gap 9 between anode 8 and shield 45 must be accurately set. Gap 9 usually varies from between 50 mils to around 200 mils, depending upon other parameters in the system. In addition, gap 56 between holder 3 and shield 45 must also be accurately set. Once set, the gaps ordinarily do not vary in a well-designed and engineered system. However, it is necessary to occasionally disassemble the anode section for cleaning purposes or to measure gap 9. In this case the gaps must be remeasured upon reassembly and reset if need be. Gap 9 is set by adjusting anode 8 with respect to plate 4. This is a complicated, tedious task and often requires experimental runs to achieve the proper gaps. It is quite cumbersome with present-day monolithic shields. Our three-part shield assembly substantially lessens this problem. The lower plate 4 of the shield may be kept in fixed position with respect to anode 8 when measuring gap 9 by the removal of sections 18 and 19 only. If it is required to merely clean the regions within gap 9, or to reset gap 56, the one-piece ring 19 may be removed without disturbing the other parts. By removing section 18 of the shield structure, the electrode-to-shield gap 9 may be accurately measured without disturbing plate 4 to facilitate setting the gap. Section 18 is ordinarily made in two parts for ease of removal.

A thin, circular aluminum shield 59 protects the anode shield from sputtered glass. When necessary to clean the glass, shield 59, which rests on spacers 5, may be removed as well as ring 19 without disturbing the other parts of shield 4.

While the invention has been particularly shown and described with reference to the preferred embodiments thereof, it will be understood by those skilled in the art that various changes in form and details may be made therein without departing from the spirit and scope of the invention.

We claim:

1. In apparatus for the radio frequency sputtering of target material onto substrates including:
   a low-pressure ionization chamber connected to a reference potential,
   a source of radio frequency power for producing a plasma across a target electrode and a substrate electrode in said chamber,
   impedance means electrically connected directly between said substrate electrode and said reference potential,
   further including a substrate electrode shield partially enclosing said substrate electrode for protecting said substrate electrode from unwanted sputtering,
   the improvement wherein:
   said shield is insulated from said reference potential.

2. Apparatus as in claim 1 wherein said impedance means includes a variable capacitance.

3. Apparatus as in claim 1 wherein said shield is insulated from said reference potential by insulation means disposed between said shield and said chamber.

4. Apparatus as in claim 3 wherein said insulation means comprises teflon.

5. Apparatus as in claim 1 wherein said apparatus is a tuned anode system operable at 13.5 MHz.

6. Apparatus as in claim 5 wherein said target electrode comprises dielectric material to be sputtered.

7. Apparatus as in claim 1 wherein:
   said substrate electrode is disc-shaped; and
   said shield means is spaced from said substrate electrode and surrounds substantially all but the surface of said substrate electrode which faces said target electrode;
   said shield means comprising:
   a plate disposed beneath said substrate electrode;
   a spacer removably mounted atop said plate surrounding a portion of the side surface of said substrate electrode;
   a ring removably mounted atop said spacer surrounding another portion of the side surface of said substrate electrode;
   whereby measurement of the spacing between said shield and said substrate electrode may be made by removal of said spacer and said ring.

8. Apparatus as in claim 7 further comprising:
   a disc-shaped substrate holder disposed atop, and overhanging the upper surface of, said substrate electrode;
   said substrate holder being spaced from said ring.

9. In apparatus for RF sputtering including a low-pressure ionization chamber connected to a reference potential, a target electrode, a target of dielectric material supported on the target electrode, a substrate electrode, a source of RF power to produce a plasma in the region between the target electrode and the substrate electrode, means for electrically insulating said target electrode and said substrate electrode from said chamber,
   impedance means electrically connected directly between said substrate electrode and said reference potential, said impedance means to provide a control of the relative RF voltage between the substrate electrode and said reference potential, and substrate electrode shield means for partial shielding of said substrate electrode,
   the improvement wherein said shield means is insulated from said reference potential.

10. Apparatus as in claim 9 wherein said impedance means is variable and said substrate electrode is adapted to support workpieces to be coated with said dielectric material, whereby said impedance means may be adjusted to control the rate of resputtering of said dielectric material from said workpiece.

11. Apparatus as in claim 10 wherein:
    said apparatus is a tuned anode system operable at 13.56 MHz,
    said dielectric material is glass; and
    said rate of resputtering is variable so as to provide a substantially zero deposition rate on said workpieces before the point of RF current instability is reached in said chamber.

12. Apparatus as in claim 9 wherein said shield is insulated from said reference potential by insulation means disposed between said shield and said chamber.

13. Apparatus as in claim 12 wherein said insulation means comprises teflon.

14. Apparatus as in claim 9 wherein:
    said substrate electrode is disc-shaped; and
    said shield means is spaced from said substrate electrode and surrounds substantially all but the surface of said substrate electrode which faces said target electrode;
    said shield means comprising:
    a plate disposed beneath said substrate electrode;
    a spacer removably mounted atop said plate surrounding a portion of the side surface of said substrate electrode;
    a ring removably mounted atop said spacer surrounding another portion of the side surface of said electrode;
    whereby measurement of the spacing between said shield and said substrate electrode may be made by removal of said spacer and said ring.

15. Apparatus as in claim 14 further comprising:
    a disc-shaped substrate holder disposed atop, and overhanging the upper surface of, said substrate electrode,
    said substrate holder being spaced from said ring.

16. Apparatus as in claim 14 further comprising:
    a protective shield means attached to the side surface of said substrate electrode shield for protecting said substrate electrode shield from sputtered particles.

* * * * *